US009881844B2

United States Patent
Yi et al.

(10) Patent No.: US 9,881,844 B2
(45) Date of Patent: Jan. 30, 2018

(54) INTEGRATED CIRCUITS WITH COPPER HILLOCK-DETECTING STRUCTURES AND METHODS FOR DETECTING COPPER HILLOCKS USING THE SAME

(71) Applicant: GLOBALFOUNDRIES Singapore Pte. Ltd., Singapore (SG)

(72) Inventors: Wanbing Yi, Singapore (SG); Juan Boon Tan, Singapore (SG); Wei Shao, Singapore (SG); Gong Shun Qiang, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 130 days.

(21) Appl. No.: 14/134,412

(22) Filed: Dec. 19, 2013

(65) Prior Publication Data
US 2015/0177319 A1 Jun. 25, 2015

(51) Int. Cl.
*H01L 21/66* (2006.01)
(52) U.S. Cl.
CPC .................................. *H01L 22/34* (2013.01)
(58) Field of Classification Search
USPC ........... 324/762.01, 663, 684; 257/E21.585, 257/E23.161, E21.021, E21.591, 762, 257/307, 774, E21.168; 438/618, 14, 438/637, 687, 12, 666, 399, 622, 667; 106/1.22
See application file for complete search history.

(56) References Cited

U.S. PATENT DOCUMENTS

| | | | |
|---|---|---|---|
| 5,481,436 A * | 1/1996 | Werther | H05K 3/3415 174/260 |
| 6,518,183 B1 * | 2/2003 | Chang | H01L 21/76883 257/E21.576 |
| 6,717,266 B1 * | 4/2004 | Marathe | H01L 21/76886 257/741 |
| 6,842,028 B2 * | 1/2005 | Song et al. | 324/750.3 |
| 6,897,147 B1 | 5/2005 | Tsai et al. | |
| 2004/0231795 A1 * | 11/2004 | Rajagopalan | C23C 16/4404 156/345.24 |
| 2004/0259378 A1 * | 12/2004 | Chambers | H01L 21/76886 438/771 |
| 2005/0151224 A1 * | 7/2005 | Abe | 257/510 |
| 2006/0091551 A1 * | 5/2006 | Lin et al. | 257/762 |
| 2006/0177630 A1 * | 8/2006 | Lee et al. | 428/123 |
| 2006/0252240 A1 * | 11/2006 | Gschwandtner | C23C 16/345 438/584 |
| 2009/0152980 A1 * | 6/2009 | Huang | 310/309 |
| 2011/0074459 A1 * | 3/2011 | Ruan et al. | 324/762.01 |

* cited by examiner

*Primary Examiner* — Melissa Koval
*Assistant Examiner* — Nasima Monsur
(74) *Attorney, Agent, or Firm* — Lorenz & Kopf, LLP

(57) ABSTRACT

An integrated circuit includes a copper hillock-detecting structure. The copper hillock-detecting structure includes a copper metallization layer and an intermediate plate structure spaced apart from adjacent to the copper metallization layer. The intermediate plate structure includes a conducting material plate. The intermediate plate structure further includes a plurality of conductive vias that are electrically and physically connected with the conducting material plate. The copper hillock-detecting structure further includes a sensing plate adjacent to the intermediate plate and electrically and physically connected with the plurality of vias such that the vias are disposed between the intermediate plate and the sensing plate.

16 Claims, 6 Drawing Sheets

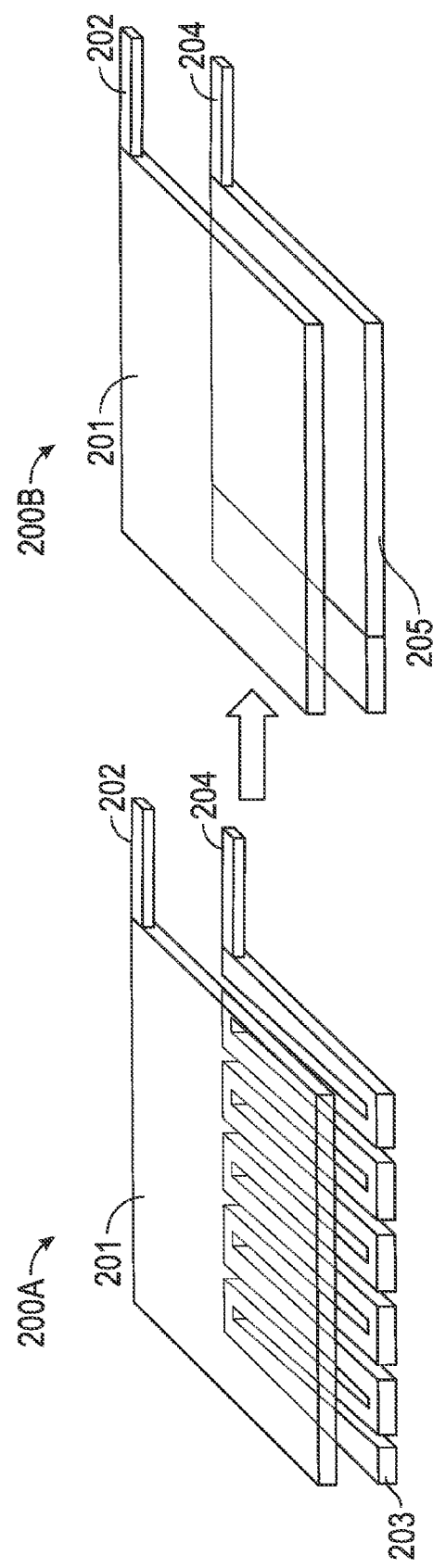

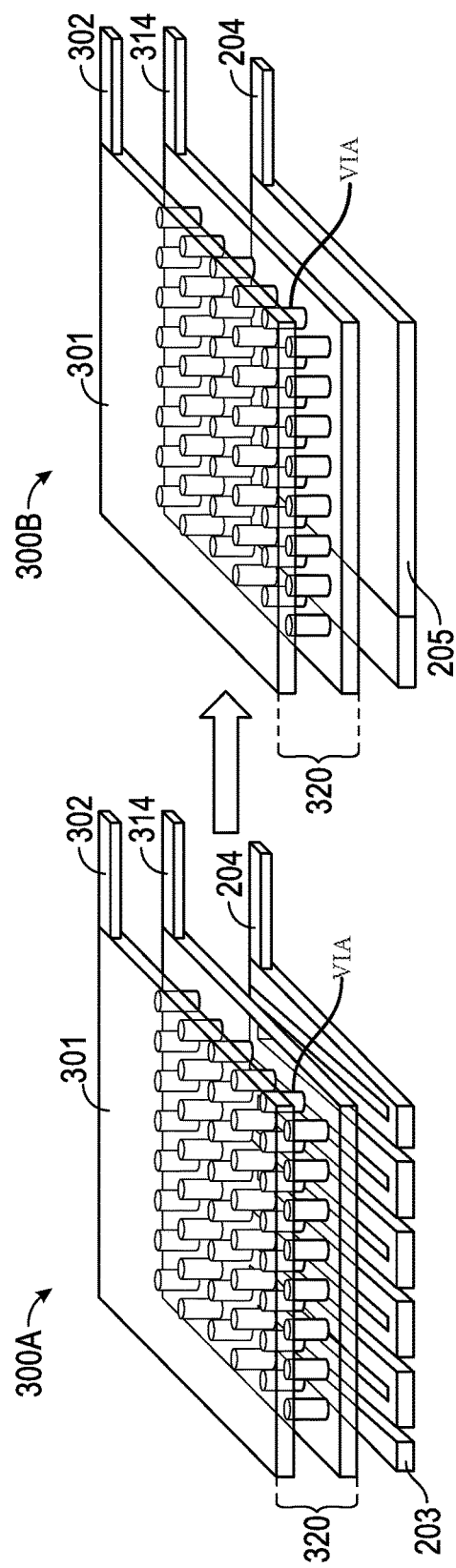

INTEGRATED CIRCUITS WITH COPPER HILLOCK-DETECTING STRUCTURES AND METHODS FOR DETECTING COPPER HILLOCKS USING THE SAME

TECHNICAL FIELD

The present disclosure generally relates to integrated circuits and methods for detecting defects in integrated circuits. More particularly, the present disclosure relates to integrated circuits with copper hillock-detecting structures and methods for detecting copper hillocks using the same.

BACKGROUND

The majority of present day integrated circuits are implemented by using a plurality of interconnected field effect transistors (FETs), also called metal oxide semiconductor field effect transistors (MOSFETs), or simply MOS transistors. A MOS transistor includes a gate electrode as a control electrode and spaced apart source and drain regions between which a current can flow. A control voltage applied to the gate electrode controls the flow of current through a channel between the source and drain regions.

In a common application for integrated circuit fabrication, a contact/via opening is etched through an insulating layer to an underlying conductive area to which electrical contact is to be made. A conducting layer material is deposited within the contact/via opening. Because of its lower bulk resistivity, Copper (Cu) is commonly employed as the conducting layer material. Often, a damascene or dual damascene process is used to provide Cu metallization. The copper is deposited within the damascene opening and polished back to form "plugs" within the contact/via opening. Then, a capping layer, such as silicon nitride or silicon carbide, is deposited over the copper plugs to prevent copper from diffusing into overlying layers.

During the deposition of the capping layer, a compressive-thermal stress may be induced on the copper, causing a vertical strain on the copper surface. FIG. 1A illustrates a copper damascene line 120 within an insulating layer 118 on a semiconductor substrate 110. Copper oxide 122 has formed naturally on the surface of the copper after planarization. FIG. 1B shows the compressive-thermal stress 130 acting along grain boundaries within the copper during deposition of the capping layer 140. FIG. 1C shows copper hillocks 132 formed by the vertical thermal strain on the copper surface. Copper hillocks reduce copper reliability and cause via induced metal island corrosion (VIMIC), and confuse defect inspection tools so that other defects cannot be detected accurately.

In the production process of integrated circuits, devices are tested to estimate the device yields and possible yield-detracting processing problems. Since the production of integrated circuits includes many processing steps and different technologies, the technological sources of electrical failure such as short circuits within the integrated circuits or open contacts are investigated using test structures in order to estimate a suitable process window and to improve the device quality as well as the processing yield. It is known that copper hillocks may confuse defect inspection tools so that other defects cannot be detected accurately. The detection of copper hillocks is thus desirable to better monitor the performance of the production process and to provide a better estimate of a suitable process window.

Accordingly, it is desirable to provide improved integrated circuits with copper hillock detection features that are robust and able to detect the presence of copper hillocks through the various defects that they induce. Additionally, it is desirable to provide such integrated circuits that are compatible with existing fabrication technologies. Furthermore, other desirable features and characteristics of the present disclosure will become apparent from the subsequent detailed description and the appended claims, taken in conjunction with the accompanying drawings and the foregoing technical field and background.

BRIEF SUMMARY

Integrated circuits with copper hillock-detecting structures are disclosed. In an exemplary embodiment, an integrated circuit includes a copper hillock-detecting structure. The copper hillock-detecting structure includes a copper metallization layer and an intermediate plate structure adjacent to the copper metallization layer. The intermediate plate structure includes a conducting material plate. The intermediate plate structure further includes a plurality of vias electrically and physically connected with the conducting material plate. The copper hillock-detecting structure further includes a sensing plate adjacent to the intermediate plate and electrically and physically connected with the plurality of vias.

In another exemplary embodiment, a method of detecting a copper hillock in an integrated circuit using a copper hillock detecting structure includes passing an electrical current through a copper metallization layer of the copper hillock detecting structure and receiving a leakage current from the copper metallization layer either through an intermediate plate structure of the copper hillock detecting structure, the intermediate plate structure including an electrically-conductive plate and a plurality of vias physically and electrically connected to the electrically-conductive plate, or through a sensing plate of the copper hillock detecting structure, the sensing plate including an electrically conductive material and being electrically and physically connected with the plurality of vias.

BRIEF DESCRIPTION OF THE DRAWINGS

The present disclosure will hereinafter be described in conjunction with the following drawing figures, wherein like numerals denote like elements, and wherein:

FIGS. 2A and 2B illustrate copper hillock detection structures of an integrated circuit generally known in the art;

FIGS. 5A and 5B illustrate exemplary copper hillock detection structures of an integrated circuit in accordance with various embodiments of the present disclosure.

DETAILED DESCRIPTION

Figure 1A:
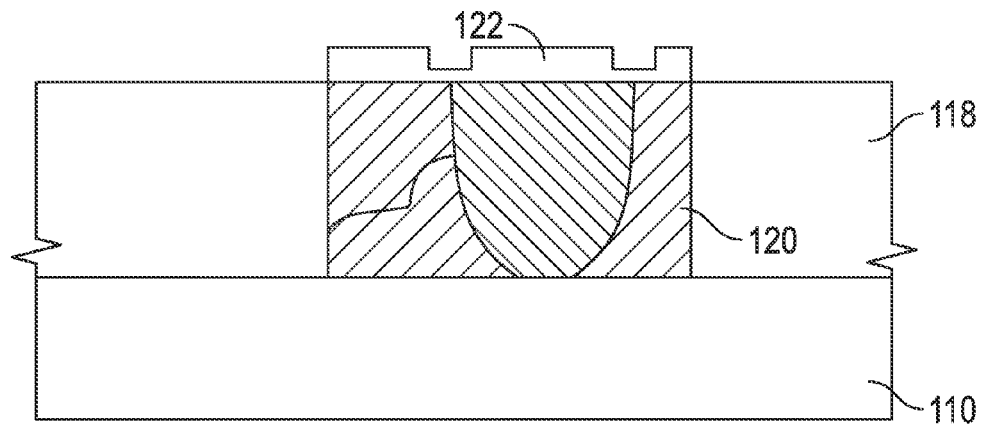
FIGS. 1A-1C illustrate the formation of a copper hillock using fabrication processes generally known in the art.
Figure 1B:
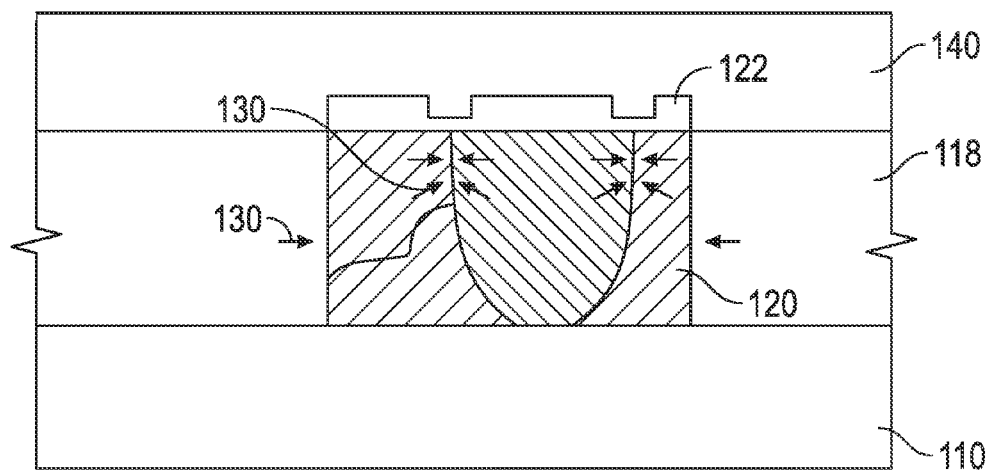
Figure 1C:
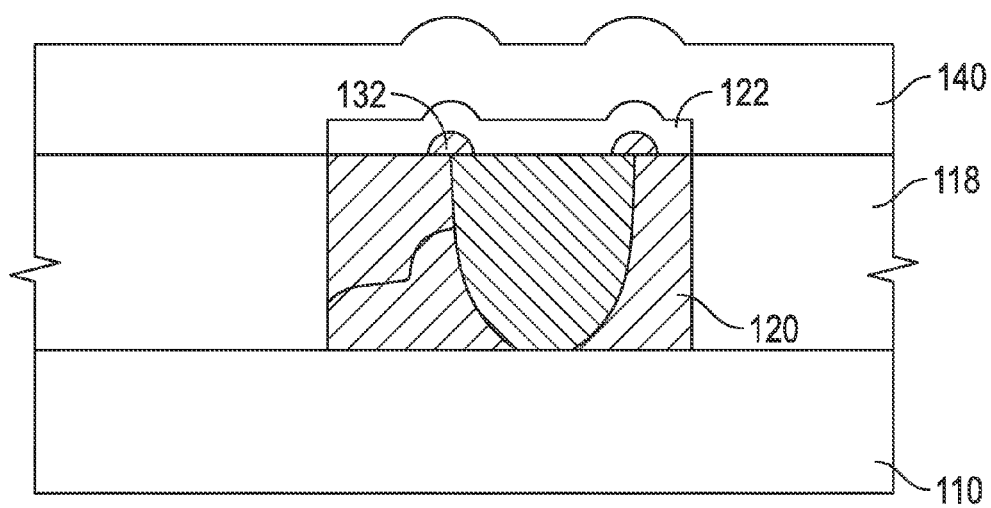

The following detailed description is merely illustrative in nature and is not intended to limit the embodiments of the subject matter or the application and uses of such embodiments. Furthermore, there is no intention to be bound by any expressed or implied theory presented in the preceding technical field, background, brief summary or the following detailed description.

The present disclosure relates to integrated circuits with hillock-detecting structures and method for detecting copper hillocks using the same. For the sake of brevity, conventional techniques related to integrated circuit device fabrication may not be described in detail herein. Moreover, the various tasks and process steps described herein may be incorporated into a more comprehensive procedure or process having additional steps or functionality not described in detail herein.

FIGS. 2A and 2B show simplified plan views of conventional structures for testing for the presence of a hillock in a copper interconnect layer. In particular, the structures test for current leakage between from the copper interconnect layer that may be caused by a hillock-induced electrical short. Specifically, conventional test structure 200A includes a copper metallization layer 203 that may be formed within a dielectric layer (not separately shown for ease of illustration). Copper metallization layer 203 has been patterned into the dielectric layer, typically utilizing a damascene process as known in the art. Copper metallization layer may have the shape of a serpentine structure (as illustrated) or a comb, each of which including adjacent projecting portions oriented substantially parallel to one another. The copper metallization layer 203 includes a terminal 204 at an end thereof for receiving electrical current from the layer 203.

Conventional test structure 200A further includes a sensing node or "plate" 201 spaced apart from but co-planar with the copper metallization layer 203. Plate 201 and layer 203 may be spaced apart by, for example, a non-illustrated dielectric layer. Plate 201 may have a substantially square or rectangular configuration, and is generally sized to coincide with at least a portion, and preferably all of the underlying area occupied by metallization layer 203. Plate 201 may be formed from any suitable conducting material, such as copper, aluminum, and the like. As with layer 203, plate 201 includes a terminal 202 at an end thereof (for example at a corner of the square or rectangular structure as shown) for receiving electrical current from the plate 201.

Test structure 200A may be formed over an underlying substrate, which may have formed thereon any type or number of integrated circuit structure such as transistors, resistors, and the like. Test structure 200A is not limited by the particular integrated circuit structures over which it is formed, or to which the copper metallization layer 203 thereof is logically connected. As such, the underling integrated circuit structures are not shown in the Figures for ease of illustration.

The test structure 200A of FIG. 2A may be operated to identify hillock-induced defects in the copper metallization layer 203. For example, test structure 200A may be employed to test for current leakage within the copper metallization layer 203. This current leakage test is performed by applying a voltage across the metallization layer 203 to induce a current therethrough, and receiving at the sensing plate 201 a sensed current revealing a leakage from the copper metallization layer 203. As previously noted, the current leakage may be caused by a short in the metallization layer 203, the short possibly being due to the presence of a copper hillock.

With reference now to FIG. 2B, this Figure is provided to illustrate the fact that as a line width of a metallization layer 203 (as in FIG. 2A) increases from the minimum design rule, eventually the serpentine configuration becomes a metallization layer plate 205. The line width may be varied among different thicknesses to test for an appropriate process window for use in the fabrication process, with the minimum design rule for the fabrication process designating the minimum possible width, and the maximum possible width occurring as the metallization layer becomes a plate, as in plate 205. In all other respects, test structure 200B operates in a manner analogous to that described above with regard to FIG. 2A.

Figure 3A:
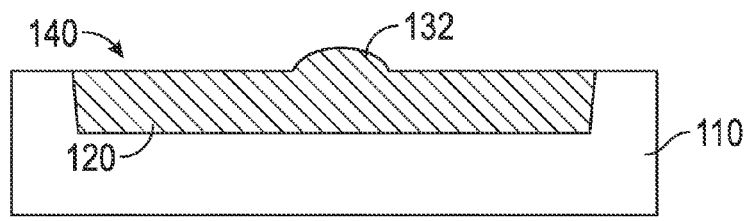
FIGS. 3A-3D illustrate a defect mechanism caused by a copper hillock that may escape detection using the hillock detection structures illustrated in FIGS. 2A and 2B.
Figure 3B:
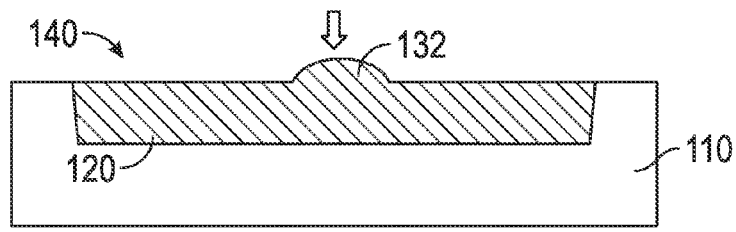
Figure 3C:
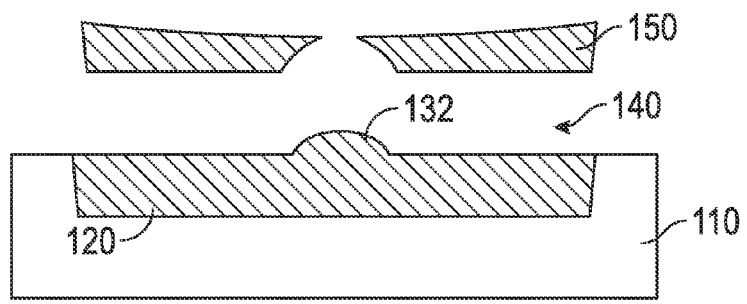
Figure 3D:
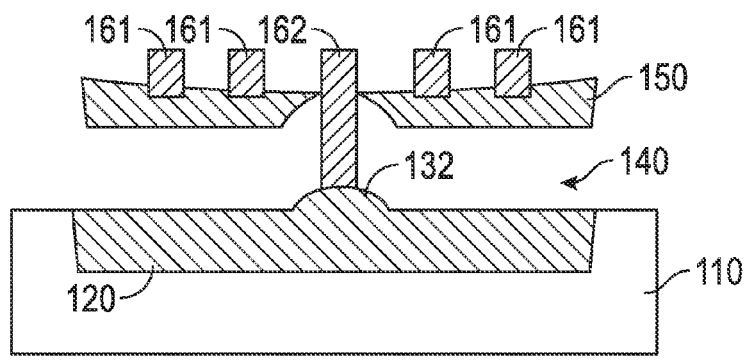

While the test structures illustrated in FIGS. 2A and 2B are suitable for testing for copper hillocks that have caused a short in the metallization layer, these test structures are not suitable for use in detecting any other device failures that may be caused by copper hillocks. In one example of a failure not detectable by the test structures 200A, 200B, as shown in FIG. 3A, a copper damascene line 120 is formed within an insulating layer 118 on a semiconductor substrate. A compressive-thermal stress acts along grain boundaries within the copper during deposition of the capping layer 140. Copper hillocks 132 are thus formed by the vertical thermal strain on the copper surface. Continuing with reference to FIG. 3B, the capping layer 140 may be etched, retaining the hillock topology in the layer 140. Thereafter, with reference to FIG. 3C, a further metallization layer 150 may be deposited and polished using chemical mechanical planarization (CMP) procedures. Due to the irregular hillock topology, and if there is sever dishing that has occurred during the CMP process in the further metallization layer 150, a hole may form. Then, with reference to FIG. 3D, a via "punch-through" may occur at the hole (that is, a via 162 unintentionally is etched through the capping layer 140 instead of into the further metallization layer 150 (as with vias 161) due to the presence of the hole in the further metallization layer 150). This via punch-through 162 may result in a short between the copper line 120 and the further metallization layer 150. This short would not be detectable using conventional test structures (as in 200A or 200B).

Figure 4A:
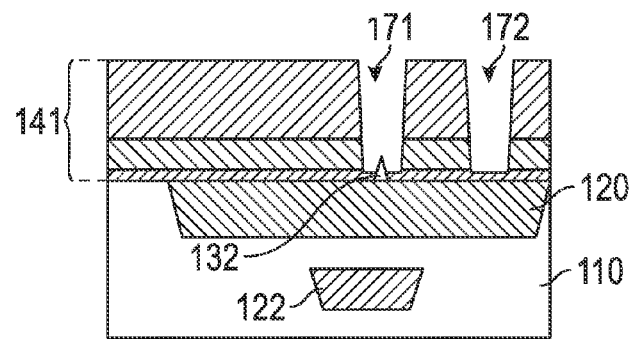
FIGS. 4A-4D illustrate another defect mechanism caused by a copper hillock that may escape detection using the hillock detection structure illustrated in FIGS. 2A and 2B.
Figure 4B:
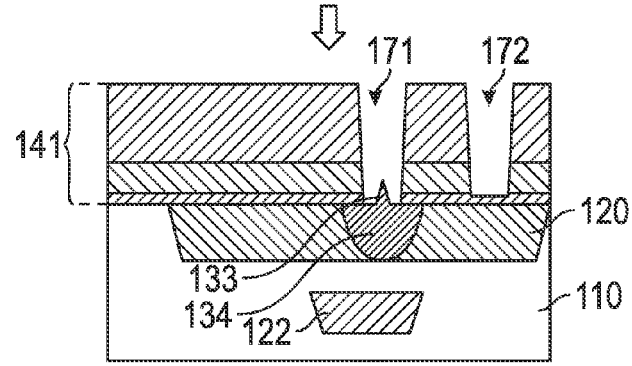
Figure 4C:
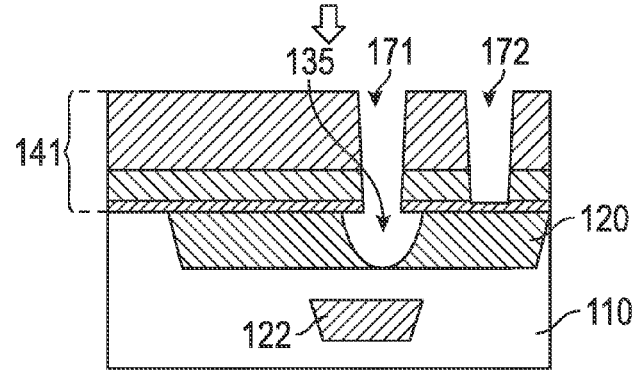
Figure 4D:
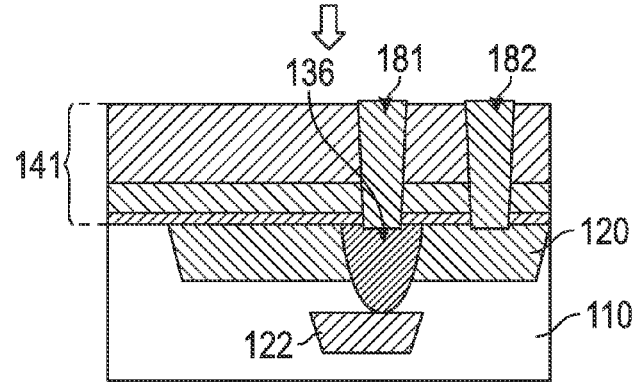

In another example of a failure not detectable by the test structures 200A, 200B, as shown in FIG. 4A, a copper line 120 is formed within an insulation layer 118 as in FIG. 3A, and a capping layer 141 is formed thereover. The capping layer 141 includes SiN (on top of Cu, normally called as capping layer) and oxide (on top of SiN). In this example, the copper line 120 overlies an underlying metal line 122. For a via first dual damascene process, the via etch will etch partially into the SiN. The remaining SiN is etched during trench etch and the trench etch will stop on the Cu line 122. A copper hillock 132 is present in the line 120 at an area thereof wherein a via hole 171 is etched. Due to the presence of the hillock 132, the capping layer under the via hole 171 is opened, thus unintentionally exposing the line 120 through the capping layer 141 (a further via hole 172 is shown that does not expose the line 120). The unintentional exposure of the line 120 through the via hole 171 may cause the copper to oxidize (indicated by oxidized hillock 133 and a portion of oxidized copper line 134 in an area below and surrounding the hillock 133), as shown in FIG. 4B. Subsequent wet cleaning process may cause the oxidized copper to be removed, as shown in FIG. 4C, forming an empty area 135 in the copper line 120. Hence, the following trench etch cannot stop on the copper line 120 in the empty area 135, and punch-through to the underlying metal line 122 and leads to unintentionally shorts. This short would not be detectable using conventional test structures (as in 200A or 200B).

Reference is now made to FIGS. 5A and 5B, which illustrate exemplary hillock-detecting test structures in accordance with various embodiments of the present disclosure. The test structures disclosed therein are beneficially configured to be able to detect copper hillocks in the conventional manner (i.e., by detecting a short in the copper line that is induced by the presence of the hillock, as described above with regard to FIGS. 2A and 2B) in addition to detecting copper hillocks that result in device failures according to FIGS. 3 and 4. Thus, the test structures disclosed in FIGS. 5A and 5B provide a more robust mechanism to detect copper hillocks than test structure known in the prior art. Further, as will be described in greater detail below, the test structures disclosed in FIGS. 5A and 5B are compatible with existing fabrication processes (thus, no special fabrication processes or techniques are required to implement these test structures).

With particular reference now to FIG. 5A, a test structure 300A is disclosed that includes, similar to the conventional test structure 200A, a copper metallization layer 203 that may be formed within a dielectric layer (not separately shown for ease of illustration). Copper metallization layer 203 has been patterned into the dielectric layer, typically utilizing a damascene process as known in the art. Copper metallization layer 203 may have the shape of a serpentine structure (as illustrated) or a comb, each of which including adjacent projecting portions oriented substantially parallel to one another. The copper metallization layer 203 includes a terminal 204 at an end thereof for receiving electrical current from the layer 203.

Exemplary test structure 300A further includes, similar to conventional test structure 200A, a sensing node or "plate" 301 spaced apart from but co-planar with the copper metallization layer 203. Plate 301 may have a substantially square or rectangular configuration, and is generally sized to coincide with at least a portion, and preferably all of the underlying area occupied by metallization layer 203. Plate 301 may be formed from any suitable conducting material, such as copper, aluminum, and the like. As with layer 203, plate 301 includes a terminal 302 at an end thereof (for example at a corner of the square or rectangular structure as shown) for receiving electrical current from the plate 301.

In contrast to conventional test structure 200A, in exemplary test structure 300A, the plate 301 and layer 203 are spaced apart by an intermediate plate structure 320 that includes a plurality of vias formed on one surface thereof. The number of vias included depends on the size of the intermediate plate structure 320. The vias may be configured in a regular array, as shown in FIG. 5A, or they may be positioned irregularly. The vias are connected at one end with the intermediate plate structure 320 and at the other end with the plate 301. Thus, the vias provide an electrical connection between the intermediate plate structure 320 and the plate 301. The vias may be formed from any suitable conducting material, such as copper, aluminum, and the like. The vias may be formed using convention fabrication processes, such as patterning, etching, and deposition processes known in the art.

Test structure 300A may be formed over an underlying substrate, which may have formed thereon any type or number of integrated circuit structure such as transistors, resistors, and the like. Test structure 300A is not limited by the particular integrated circuit structures over which it is formed, or to which the copper metallization layer 203 thereof is logically connected. As such, the underling integrated circuit structures are not shown in the Figures for ease of illustration.

The test structure 300A of FIG. 5A may be operated to identify not only hillock-induced defects in the copper metallization layer 203, but also the various "punch-through" defects identified in FIGS. 3 and 4. For example, the failure mode is detected and judged by both electrical readout (as the purpose of this new electrical structure disclosure) and the physical failure analysis.

In general, fabrication of the test structures 300A, 300B, and the integrated circuits within which they are formed, may be performed using processing steps that as are well-known in the art (not illustrated). These steps conventionally include, for example, preparing photolithographic masks and using the masks to pattern a plurality of features on the semiconductor wafer using material deposition and etching procedures, for example, the formation of semiconductive structures, the formation of metals gates, forming various insulating layers, the formation of doped source and drain regions, the formation of contacts (formed by depositing a photoresist material layer over the insulating layer, lithographic patterning, etching to form contact voids, and depositing a conductive material in the voids to form the contacts), and the formation of one or more patterned conductive layers, among many others. The subject matter disclosed herein is not intended to exclude any processing steps to form the test structures and the completed integrated circuits as are known in the art.

As such, the present disclosure provides improved integrated circuits with copper hillock detection features that are robust and able to detect the presence of copper hillocks through the various defects that they induce. Additionally, the present disclosure provides such integrated circuits that are compatible with existing fabrication technologies.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. An integrated circuit comprising a copper hillock-detecting structure, the copper hillock-detecting structure comprising:
   a copper metallization layer having an upper surface, wherein an entirety of the upper surface of the copper metallization layer is disposed in a first geometric plane, and wherein the entirety of the upper surface of the copper metallization layer is disposed within a first area of the first geometric plane;
   an intermediate plate structure, having a lower surface and an upper surface, separated from the copper metallization layer by a first dielectric layer, wherein the first dielectric layer is disposed over and in physical contact with an entirety of the first area of the first geometric plane, wherein the first dielectric layer extends upwards from the first area of the first geometric plane to the intermediate plate structure so as to be in physical contact with an entirety of the lower surface of the intermediate plate structure, such that there is no conductive electrical connection between the copper metallization layer and the intermediate plate structure, wherein an entirety of the upper surface of the intermediate plate structure is disposed in a second geometric plane, wherein the first and second geometric planes are parallel to and spaced apart from one another, wherein the intermediate plate structure comprises an electrically conductive material, and wherein the intermediate plate structure further comprises a plurality of vias at its upper surface that are electrically and physically connected with the conducting material plate such that electrical current is able to flow through the intermediate plate structure directly to the plurality of vias; and a sensing plate, having a lower surface that comprises an electrically conductive material and that is separated from the intermediate plate by a second dielectric layer and the plurality of vias, and that is electrically and physically connected with each of the plurality of vias at its lower surface such that electrical current is able to flow through the sensing plate directly to the plurality of vias, wherein an entirety of the lower surface of the sensing plate is disposed in a third geometric plane, wherein the second and third geometric planes are parallel to and spaced apart from one another, wherein the second geometric plane is disposed in between the first and third geometric planes, wherein no portion of the first geometric plane passes through any portion of either the intermediate plate structure or the sensing plate, wherein no portion of the second geometric plane passes through any portion of either the copper metallization layer or the sensing plate, and wherein no portion of the third geometric plane passes through any portion of the copper metallization layer or the intermediate plate structure.

2. The integrated circuit of claim 1, wherein the copper metallization layer is formed within an electrically insulative dielectric material layer.

3. The integrated circuit of claim 1, wherein the intermediate plate structure, including both the conducting material plate and the plurality of vias, comprises a copper material or an aluminum material.

4. The integrated circuit of claim 1, wherein the sensing plate structure comprises a copper material or an aluminum material.

5. The integrated circuit of claim 1, wherein the copper metallization layer is configured as a serpentine structure.

6. The integrated circuit of claim 1, wherein the copper metallization layer is configured as comb structure.

7. The integrated circuit of claim 1, wherein the copper metallization layer comprises a terminal for receiving electrical current therefrom.

8. The integrated circuit of claim 1, wherein the intermediate plate structure comprises a terminal for receiving electrical current therefrom.

9. The integrated circuit of claim 1, wherein the sensing plate comprises a terminal for receiving electrical current therefrom.

10. The integrated circuit structure of claim 1, wherein the plurality of vias are disposed on the intermediate plate structure in a regular array configuration.

11. The integrated circuit structure of claim 1, wherein the copper metallization layer, the intermediate plate structure, and the sensing plate comprise parallel planar structures.

12. The integrated circuit of claim 1, wherein the copper metallization layer is physically separated from the plurality of vias by the intermediate plate structure.

13. The integrated circuit of claim 12, wherein the plurality of vias are disposed on the upper surface of the intermediate plate structure in an n×m array wherein n and m are each at least two.

14. The integrated circuit of claim 13, wherein the first area of the first plane, an area occupied by the upper surface of the intermediate plate structure in the second plane, and an area occupied by the lower surface of the sensing plate in the third plane are all substantially equal in area to one another.

15. A method for detecting a copper hillock in an integrated circuit using a copper hillock detecting structure, wherein the copper hillock detecting structure comprises:

a copper metallization layer having an upper surface, wherein an entirety of the upper surface of the copper metallization layer is disposed in a first geometric plane, and wherein the entirety of the upper surface of the copper metallization layer is disposed within a first area of the first geometric plane:

an intermediate plate structure, having a lower surface and an upper surface, separated from the copper metallization layer by a first dielectric layer, wherein the first dielectric layer is disposed over and in physical contact with an entirety of the first area of the first geometric plane, wherein the first dielectric layer extends upwards from the first area of the first geometric plane to the intermediate plate structure so as to be in physical contact with an entirety of the lower surface of the intermediate plate structure, such that there is no conductive electrical connection between the copper metallization layer and the intermediate plate structure, wherein an entirety of the upper surface of the intermediate plate structure is disposed in a second geometric plane, wherein the first and second geometric planes are parallel to and spaced apart from one another, wherein the intermediate plate structure comprises an electrically conductive material, and wherein the intermediate plate structure further comprises a plurality of vias at its upper surface that are electrically and physically connected with the conducting material plate such that electrical current is able to flow through the intermediate plate structure directly to the plurality of vias; and a sensing plate having a lower surface, that comprises an electrically conductive material and that is separated from the intermediate plate by a second dielectric layer and the plurality of vias, and that is electrically and physically connected with each of the plurality of vias at its lower surface such that electrical current is able to flow through the sensing plate directly to the plurality of vias, wherein an entirety of the lower surface of the sensing plate is disposed in a third geometric plane, wherein the second and third geometric planes are parallel to and spaced apart from one another, and wherein the second geometric plane is disposed in between the first and third geometric planes, wherein no portion of the first geometric plane passes through any portion of either the intermediate plate structure or the sensing plate, wherein no portion of the second geometric plane passes through any portion of either the copper metallization layer or the sensing plate, and wherein no portion of the third geometric plane passes through any portion of the copper metallization layer or the intermediate plate structure, wherein the method comprises the steps of:

passing an electrical current through the copper metallization layer of the copper hillock detecting structure; and attempting to detect a leakage current from the copper metallization layer either through the intermediate plate structure of the copper hillock detecting structure or through the sensing plate of the copper hillock detecting structure.

16. The method of claim 15, wherein passing the electrical current comprises passing the electrical current through a terminal of the copper metallization layer.

* * * * *